(12) United States Patent
Kimura et al.

(10) Patent No.: US 11,627,663 B2
(45) Date of Patent: Apr. 11, 2023

(54) OPTICAL UNIT

(71) Applicant: NIDEC CORPORATION, Kyoto (JP)

(72) Inventors: Soichiro Kimura, Kyoto (JP); Tomohiro Egawa, Kyoto (JP); Genki Tanaka, Kyoto (JP); Shinri Ono, Kyoto (JP); Tsungting Hsieh, Taipei (TW); Kwun-Yao Ho, Taipei (TW); Tsutomu Arai, Nagano (JP); Shogo Kasahara, Nagano (JP); Shinji Hatano, Nagano (JP)

(73) Assignee: NIDEC CORPORATION, Kyoto (JP)

( * ) Notice: Subject to any disclaimer, the term of this patent is extended or adjusted under 35 U.S.C. 154(b) by 1 day.

(21) Appl. No.: 17/169,329

(22) Filed: Feb. 5, 2021

(65) Prior Publication Data
US 2021/0251081 A1   Aug. 12, 2021

(30) Foreign Application Priority Data

Feb. 7, 2020 (JP) .............................. JP2020-020060

(51) Int. Cl.
   *H05K 1/18* (2006.01)
   *H05K 1/02* (2006.01)
   *G03B 5/00* (2021.01)

(52) U.S. Cl.
   CPC .............. *H05K 1/189* (2013.01); *G03B 5/00* (2013.01); *H05K 1/0281* (2013.01); *H05K 2201/056* (2013.01)

(58) Field of Classification Search
   CPC ...... H05K 1/028; H05K 1/0393; H05K 1/147; H05K 1/118; H05K 1/189; H05K 1/0281; H05K 3/4691; H05K 2201/056; H05K 2201/0154; H05K 2201/055; H05K 2201/10204; H05K 2201/2009; G03B 2205/0007; G03B 2205/0069
   See application file for complete search history.

(56) References Cited

U.S. PATENT DOCUMENTS

| | | | |
|---|---|---|---|
| 6,194,664 B1* | 2/2001 | Zamora ................. | H02G 11/00 |
| | | | 174/117 F |
| 10,185,156 B2 | 1/2019 | Minamisawa et al. | |
| 12,883,362 | 4/2021 | Minamisawa | |
| 2012/0184130 A1* | 7/2012 | Yaguchi ................. | H01R 12/53 |
| | | | 439/493 |
| 2018/0284477 A1* | 10/2018 | Minamisawa ......... | G03B 17/02 |

FOREIGN PATENT DOCUMENTS

| | | |
|---|---|---|
| CN | 111665677 A | 9/2020 |
| CN | 111683454 A | 9/2020 |
| JP | 200793953 A | 4/2007 |
| JP | 202086367 A | 6/2020 |

* cited by examiner

*Primary Examiner* — Roshn K Varghese
(74) *Attorney, Agent, or Firm* — Hauptman Ham, LLP

(57) ABSTRACT

An optical unit includes a movable body including an optical module, a fixed body, a support mechanism, a flexible printed circuit board, and a fixing part. The fixing part is superposed on a bent part formed by bending the flexible printed circuit board. At least a part of the fixing part is fixed to the bent part of the flexible printed circuit board.

17 Claims, 9 Drawing Sheets

OPTICAL UNIT

CROSS-REFERENCE TO RELATED APPLICATIONS

The present invention claims priority under 35 U.S.C. § 119 to Japanese Patent Application No. 2020-020060 filed on Feb. 7, 2020, the entire content of which is incorporated herein by reference.

FIELD OF THE INVENTION

The present disclosure relates to an optical unit.

BACKGROUND

An image blur may occur due to camera shake during shooting of a still image or moving image with a camera. For this reason, an image stabilizer has been put into practical use to enable shooting of a clear image with image blur being reduced. When the camera shakes, the image stabilizer often addresses a problem caused by the camera shake by correcting the position and orientation of a camera module according to the camera shake.

In the conventional image stabilizer, an FPC is attached to the back side of the camera module, and an image signal captured by the camera module is extracted to the outside via the FPC.

However, in the conventional image stabilizer, a flexible printed circuit board is rubbed when moving following the camera module, which increases a load and may require an increase in a drive current of the camera module.

SUMMARY

An exemplary embodiment of the present disclosure includes a movable body including an optical module, a fixed body, a support mechanism, a flexible printed circuit board, and a fixing part. The support mechanism supports the movable body in a rotatable manner with respect to the fixed body with a single or a plurality of directions intersecting an optical axis direction of the optical module as a direction of a rotation axis. The flexible printed circuit board has a first end connected to a connection part provided on the movable body, and is disposed on a side in a first intersecting direction intersecting the optical axis direction with respect to the movable body. The fixing part is disposed so as to be superposed onto a bent part formed by bending the flexible printed circuit board. The fixing part is at least partially fixed to the bent part.

The above and other elements, features, steps, characteristics and advantages of the present disclosure will become more apparent from the following detailed description of the preferred embodiments with reference to the attached drawings.

DETAILED DESCRIPTION

Figure 1:
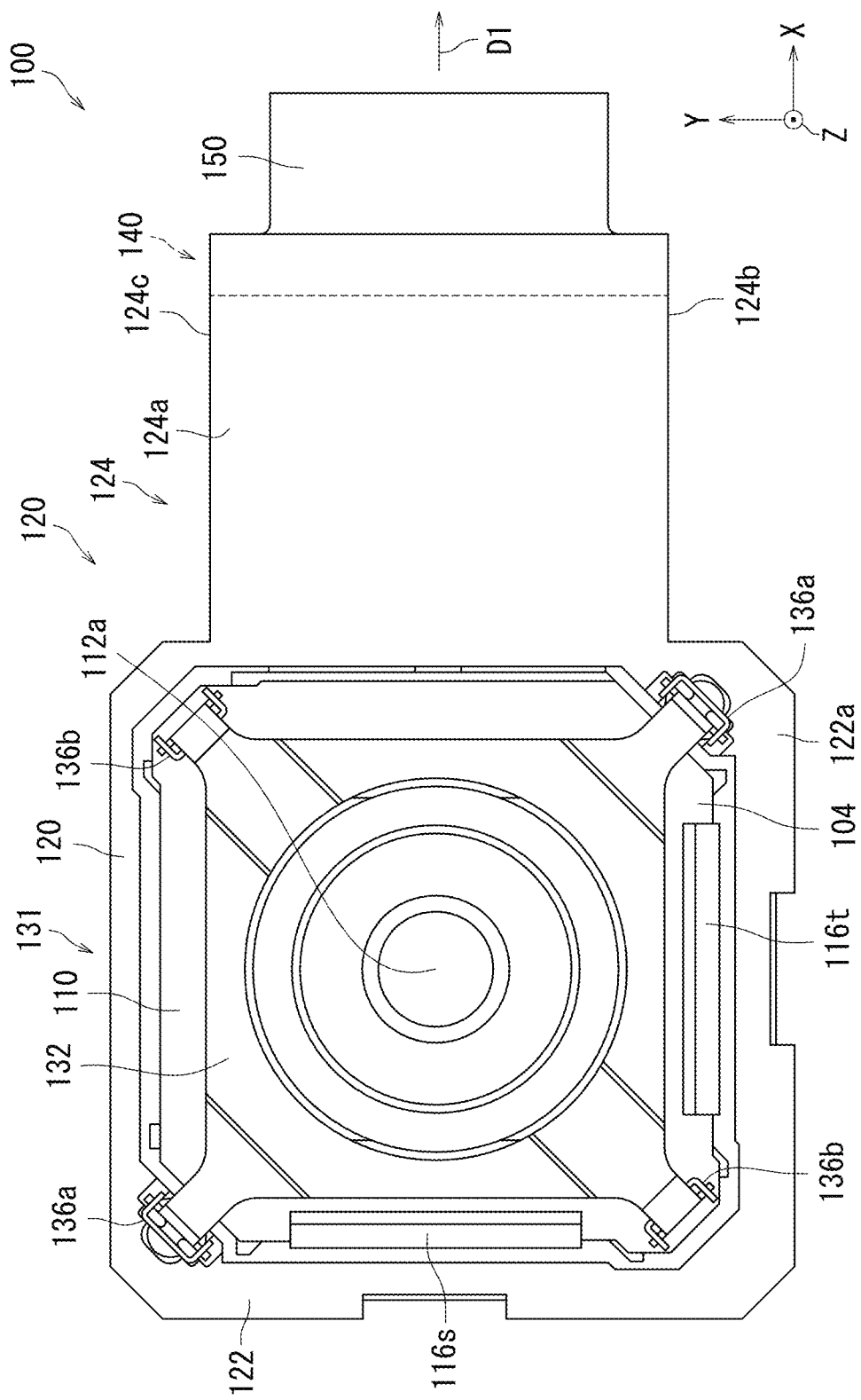
FIG. 1 is a plan view of an optical unit according to an embodiment of the present disclosure.

An exemplary embodiment of an optical unit according to the present disclosure will be described below with reference to the drawings. In the drawings, the same or corresponding parts are designated by the same reference signs, and the description thereof will not be repeated. In the specification of the present application, an X axis, a Y axis, and a Z axis that are orthogonal to each other may be described in order to facilitate the understanding of the disclosure.

Figure 2:
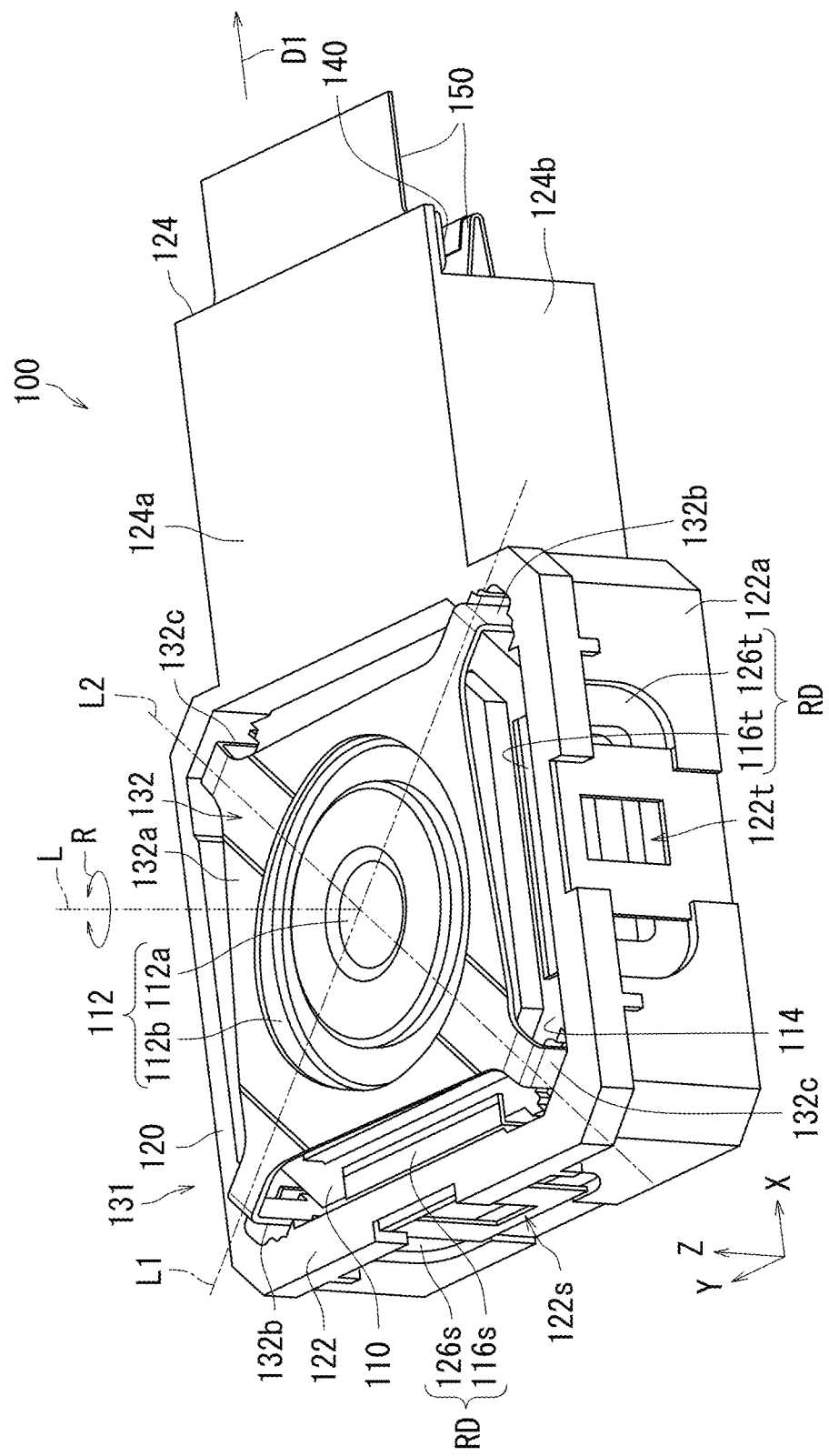
FIG. 2 is a perspective view of the optical unit according to the embodiment.
Figure 3:
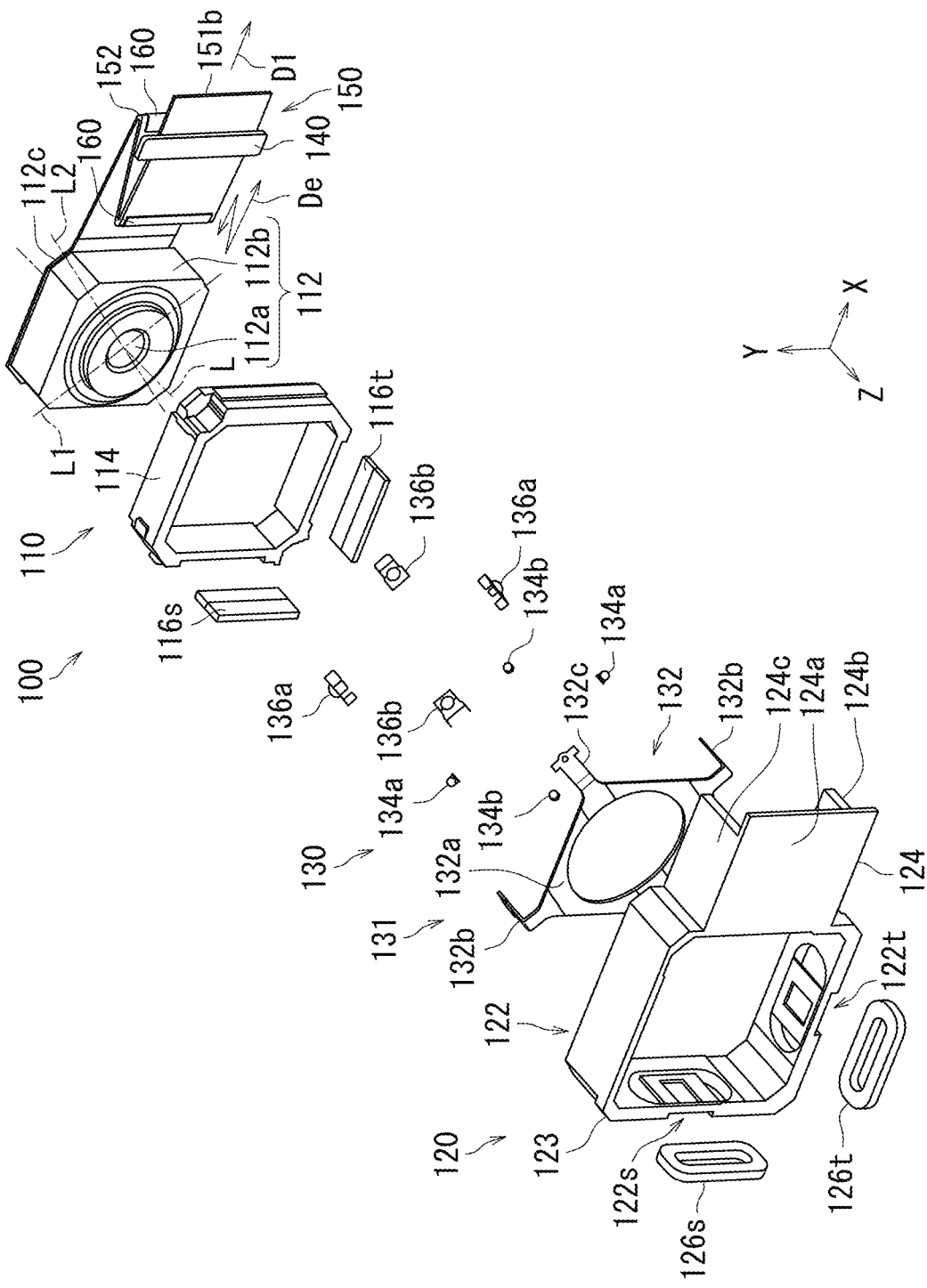
FIG. 3 is an exploded perspective view of the optical unit according to the embodiment.
Figure 4:
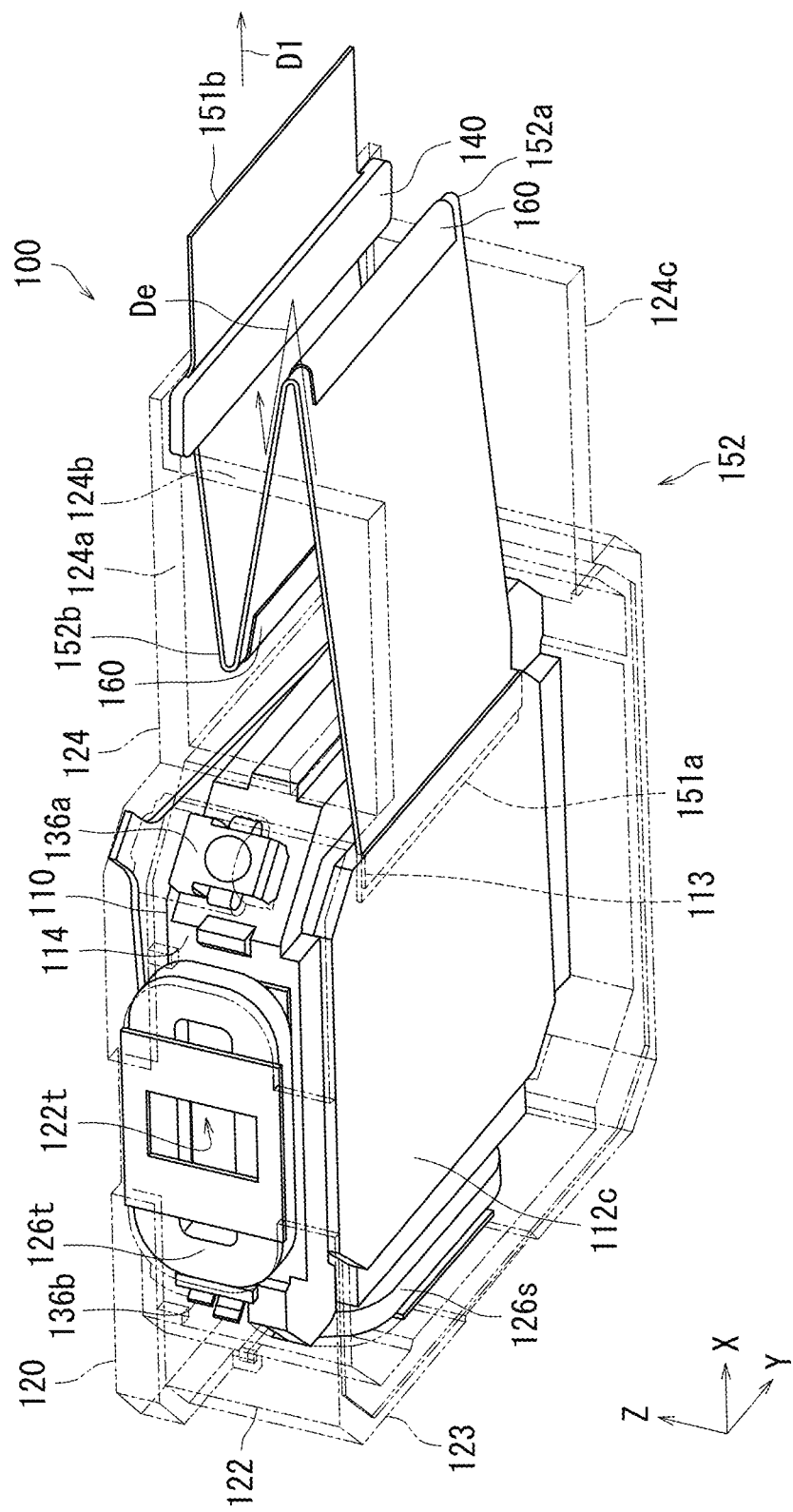
FIG. 4 is a perspective view of the optical unit according to the embodiment.

First, an optical unit 100 according to the present embodiment will be described with reference to FIGS. 1 to 4. FIG. 1 is a plan view of the optical unit 100 according to the present embodiment, and FIG. 2 is a perspective view of the optical unit 100 according to the present embodiment. FIG. 3 is an exploded perspective view of the optical unit 100 according to the present embodiment, and FIG. 4 is a perspective view of the optical unit 100 according to the present embodiment. In FIG. 4, a fixed body 120 is indicated by a chain line in order to avoid excessive complexity of the drawing.

Further, in FIGS. 2 and 3, a dot-dash line denoted by reference sign L indicates an optical axis of an optical module 112, a dot-dash line denoted by reference sign L1 indicates a first axis that intersects the optical axis L, and a dot-dash line denoted by reference sign L2 indicates a second axis L2 that intersects the optical axis L and the first axis L1. Reference sign R indicates a circumferential direction with the optical axis L as a central axis. In each figure, the Z-axis direction is an optical axis direction, the X-axis direction is a direction that intersects the optical axis, in other words, an axial direction of yawing, and the Y-axis direction is the direction that intersects the optical axis, in other words, an axial direction of pitching.

The configuration of the optical unit 100 according to the present embodiment will be described with reference to FIGS. 1 to 4. The optical unit 100 includes a movable body 110 including the optical module 112, a fixed body 120, a support mechanism 130, a positioning part 140, a flexible printed circuit board 150, and a fixing part 160. The fixed body 120 holds the movable body 110 such that the movable body 110 is displaceable in a direction with the Y-axis direction as a rotation axis (pitching direction) and in a direction with the X-axis direction as a rotation axis (yawing direction).

Further, the support mechanism 130 supports the movable body 110 in a rotatable manner with respect to the fixed body 120 with a single or a plurality of directions intersecting the optical axis direction of the optical module 112 as a direction of a rotation axis. For example, the support mechanism 130 includes a rotation drive mechanism RD that drives the movable body 110 in the pitching direction and the yawing direction, and supports the movable body 110 such that the movable body 110 is rotatable in the pitching direction and the yawing direction with respect to the fixed body 120.

As shown in FIGS. 1 to 4, the movable body 110 includes the optical module 112, a holder 114, a magnet 116s, and a magnet 116t. The holder 114 has a frame shape. The optical module 112 is housed in the holder 114. The optical module 112 is inserted into an opening of the holder 114 and faces an inner peripheral surface of the holder 114.

The magnet 116s and the magnet 116t are attached to the holder 114. Specifically, the magnet 116s and the magnet 116t are attached to the outer peripheral surface of the holder 114.

The optical module 112 is used, for example, as a thin camera mounted on a camera-equipped mobile phone, a tablet PC, or the like. In the present embodiment, the optical module 112 has a substantially rectangular box shape. The optical axis L of the optical module 112 is directed to a subject, and the optical module 112 captures an image in a direction along the optical axis L.

As an example, the optical module 112 has incorporated therein an actuator that corrects pitching vibration (vibration in the rotation direction with the Y-axis direction as a rotation axis) and yawing vibration (vibration in the rotation direction with the X-axis direction as a rotation axis) generated in the optical module 112. The actuator corrects pitching vibration and yawing vibration. In the present embodiment, the optical module 112 can correct pitching vibration and yawing vibration, but is not limited thereto. The optical module 112 may be capable of correcting, for example, either pitching vibration or yawing vibration.

The optical module 112 has a lens 112a and a housing 112b. The lens 112a is housed in the housing 112b, and at least a portion of the lens 112a is exposed from the surface of the housing 112b. The lens 112a is disposed on the subject side. The housing 112b has a rectangular shape. An optical device or the like for capturing an image is built in the housing 112b.

The holder 114 is a rectangular frame-shaped member provided so as to surround four surfaces of the optical module 112 except for the front surface (the surface on the subject side) on which the lens 112a of the optical module 112 is provided and the rear surface opposite to the front surface. The holder 114 of the present embodiment is configured such that the optical module 112 is detachably mounted thereto as one example. When the movable body 110 is attached to the fixed body 120, the magnets 116s and 116t for correcting pitching vibration and yawing vibration are attached to the outer surface of the holder 114 by utilizing the two surfaces facing the fixed body 120.

As shown in FIGS. 1 to 4, the movable body 110 is disposed inside the fixed body 120. The fixed body 120 includes a fixed frame 122, a coil 126s, and a coil 126t. The coil 126s and the coil 126t are attached to the fixed frame 122.

Coil mounting parts 122s and 122t are provided on the outer peripheral surface of the fixed frame 122. As shown in FIGS. 2 and 3, the coils 126s and 126t are attached to the coil mounting parts 122s and 122t, respectively. In the present embodiment, the coil 126s and the coil 126t are winding coils as an example. However, as the coil 126s and the coil 126t, a pattern substrate (coil substrate) in which a coil is incorporated into a substrate wiring as a pattern may be used.

In the present embodiment, the fixed frame 122 has a frame part 123 and a coupling part 124. The frame part 123 has a frame shape. The coupling part 124 is coupled to the frame part 123. The coupling part 124 is located on a side in the X-axis direction with respect to the frame part 123. The frame part 123 has a rectangular frame shape provided so as to surround at least three surfaces of the holder 114 of the movable body 110 in the circumferential direction (R direction) about the optical axis L as the central axis.

The coupling part 124 includes a wall 124a, a wall 124b, and a wall 124c. The wall 124a, the wall 124b, and the wall 124c are provided outside an area where the movable body 110 is placed along the X-axis direction. Here, the wall 124a covers the front surface (the surface on the subject side), and the wall 124b and the wall 124c cover in the Y-axis direction. In the present embodiment, the area of the frame part 123 surrounded by the wall 124a, the wall 124b, and the wall 124c on the coupling part 124 side from three directions forms a space (a wall is not provided).

In the present embodiment, the fixed body 120 covers at least a part of the flexible printed circuit board 150 described later with the wall 124a, the wall 124b, and the wall 124c from three directions. Since at least a part of the flexible printed circuit board 150 is covered, it is possible to prevent the flexible printed circuit board 150 from being damaged due to contact with other components. The flexible printed circuit board 150 is positioned in the Z-axis direction with the positioning part 140 (see FIG. 4).

In the coupling part 124, a wall is not provided on the side facing the wall 124a. This is to improve workability for placing the flexible printed circuit board 150 on the coupling part 124. However, the present disclosure is not limited to such a configuration, and a wall may be provided on the side facing the wall 124a. Alternatively, a wall that can be attached after the flexible printed circuit board 150 is placed on the coupling part 124 may be provided.

In the present embodiment, when the movable body 110 is placed inside the fixed body 120, the magnet 116s faces the coil 126s, and the magnet 116t faces the coil 126t. In the present embodiment, a pair of the magnet 116s and the coil 126s and a pair of the magnet 116t and the coil 126t form the rotation drive mechanisms RD, respectively. The rotation drive mechanisms RD can correct pitching and yawing of the movable body 110.

For example, the pitching and yawing of the movable body 110 are corrected as follows. When the optical unit 100 vibrates in both of or one of the pitching direction and the yawing direction, the vibration is detected by a magnetic sensor (Hall element) (not shown), and the rotation drive mechanisms RD are driven on the basis of the result. Alternatively, the vibration of the optical unit 100 may be detected using a vibration detection sensor (gyroscope) or the like. The rotation drive mechanisms RD correct the vibration on the basis of the vibration detection result. That is, a current flows through the coils 126s and 126t so as to move the movable body 110 in a direction of canceling the vibration of the optical unit 100, whereby the vibration is corrected.

In the optical unit 100 according to the present embodiment, the rotation drive mechanisms RD rotate the movable body 110 with respect to the fixed body 120 with the axial direction of pitching and the axial direction of yawing as rotation axes. Here, the rotation drive mechanisms RD are preferably placed at positions other than positions on the side where the flexible printed circuit board 150 is provided in the X-axis direction (other than positions on the side in a first intersecting direction intersecting the direction of the optical axis L) relative to the movable body 110. Since the rotation drive mechanisms RD can be placed on the side where the flexible printed circuit board 150 is not provided, it is not necessary to increase the size of the optical unit 100 in order to suppress the contact between the rotation drive mechanisms RD and the flexible printed circuit board 150, whereby the optical unit 100 can be downsized. Note that, in this specification, the wording "rotation" or "rotate" does not necessarily mean that a target member rotates 360° or is able to rotate 360°, and includes a mode in which the target member swings in the direction of rotation.

The drive source for the operation of correcting the vibration is not limited to a voice coil motor including a pair of the coils 126s and 126t and a pair of the magnets 116s and 116t that function as the rotation drive mechanism RD. A stepping motor, a piezo element, or the like may be used as the drive source.

The support mechanism 130 includes a frame 132, first support parts 134a, second support parts 134b, sheet metals 136a, and sheet metals 136b. The frame 132 is provided on the subject side. The frame 132 has a rectangular main body 132a, protrusions 132b, and protrusions 132c. The protrusions 132b project parallel to the optical axis direction from two opposing corners of the main body 132a. Similarly, the protrusions 132c project parallel to the optical axis direction from another two opposing corners of the main body 132a. The protrusions 132b and the protrusions 132c are connected to the frame 132. The protrusions 132b and the protrusions 132c may be separate members, or may be formed by bending the four corners of the frame 132 90 degrees in the optical axis direction.

Each of the sheet metals 136a has a hemispherical convex curved surface. The convex curved surface of the sheet metal 136a is directed toward the outside of the optical unit 100. Each of the sheet metals 136b has a hemispherical convex curved surface. The convex curved surface of the sheet metal 136b is directed toward the inside of the optical unit 100.

The sheet metals 136a are disposed at two opposing corners of the four corners of the rectangular frame-shaped frame part 123 of the fixed body 120, and the sheet metals 136b are disposed at two opposing corners of the four corners of the rectangular frame-shaped movable body 110. The rectangular frame-shaped frame part 123 and the rectangular frame-shaped movable body 110 are disposed so that the positions of the four corners are aligned, and the sheet metals 136a and the sheet metals 136b are disposed one by one at the four corners.

In the support mechanism 130, the first support parts 134a that support the movable body 110 in a rotatable manner around the first axis L1 are disposed on the protrusions 132b, and the second support parts 134b that are supported by a member of the fixed body 120 in a rotatable manner around the second axis L2 are disposed on the protrusions 132c (see FIG. 3).

The frame 132, the protrusions 132b, and the protrusions 132c constitute a gimbal mechanism 131. The gimbal mechanism 131 is a mechanism having a spring property formed by bending a metallic flat plate material. Note that it is not necessary that the protrusions 132b and 132c entirely have a plate shape, and they may partially have a plate shape to exhibit spring property. Further, it is also possible to form one of the protrusions 132b and the protrusions 132c into a shape other than the plate shape (for example, a rod shape).

In the present embodiment, in the support mechanism 130, the first support parts 134a provided on the protrusions 132b are disposed inside the hemispherical convex curved surfaces of the sheet metals 136a directed outward. The sheet metals 136a support the gimbal mechanism 131 with respect to the fixed body 120 with such a configuration. Further, the second support parts 134b provided on the protrusions 132c are disposed inside the hemispherical convex curved surfaces of the sheet metals 136b directed inward. The sheet metals 136b support the gimbal mechanism 131 with respect to the movable body 110 with such a configuration. That is, the support mechanism 130 of the present embodiment can support the movable body 110 with respect to the fixed body 120 in a rotatable manner with a single or a plurality of directions (at least one of the X-axis direction and the Y-axis direction) intersecting the optical axis direction (Z-axis direction) as a rotation axis direction. The support mechanism 130 of the present embodiment allows the rotation of the movable body 110 with the axial direction of pitching as a rotation axis and the rotation of the movable body 110 with the axial direction of yawing as a rotation axis. Note that the support mechanism 130 may be configured to also allow the rotation of the movable body 110 in a rolling direction.

As shown in FIGS. 3 and 4, the optical module 112 further includes an image sensor 112c. The image sensor 112c is disposed on the side opposite to the subject. As shown in FIG. 4, the flexible printed circuit board 150 is connected to a connection part 113 of the image sensor 112c. Specifically, a first end 151a of the flexible printed circuit board 150 is inserted into the image sensor 112c.

Here, the connection part 113 of the image sensor 112c is formed on the coupling part 124 side, and the flexible printed circuit board 150 is covered by the wall 124a, the wall 124b, and the wall 124c of the coupling part 124 from directions other than the side opposite to the subject.

The positioning part 140 is disposed on the side in the first intersecting direction with respect to the movable body 110. The positioning part 140 positions the flexible printed circuit board 150.

In FIGS. 1 to 4, the positioning part 140 is mounted apart from the wall 124a, and is placed across the wall 124b and the wall 124c.

The flexible printed circuit board 150 extends in an extension direction De. The flexible printed circuit board 150 is bent at a bent part 152, and the orientation of the extension direction De is changed for each bent portion of the bent part 152. Here, the flexible printed circuit board 150 is bent twice. The flexible printed circuit board 150 has the first end 151a located at one end in the extension direction De and a second end 151b located at the other end in the extension direction De.

For example, the outer surface of the flexible printed circuit board 150 is formed of a polyimide resin. Further, for example, the width (length along the Y-axis direction) of the flexible printed circuit board 150 is 3 mm or more and 50 mm or less. In one example, the width of the flexible printed circuit board 150 is 5 mm or more and 30 mm or less.

As shown in FIG. 4, the flexible printed circuit board 150 is inserted into the image sensor 112c of the movable body 110, and is connected to the connection part 113 of the image sensor 112c. The flexible printed circuit board 150 is disposed on the side in the first intersecting direction with respect to the movable body 110. Further, the second end 151b of the flexible printed circuit board 150 in the optical axis direction (Z-axis direction) is positioned by the positioning part 140 disposed on the side in the first intersecting direction with respect to the movable body 110. The positioning part 140 is a plate-shaped member attached so as to form a gap, and the flexible printed circuit board 150 is positioned in the Z-axis direction by passing through the gap.

The flexible printed circuit board 150 has the bent part 152 formed by bending the flexible printed circuit board 150 at least twice between the connection part 113 and the positioning part 140. As shown in FIGS. 3 and 4, the flexible printed circuit board 150 of the present embodiment is bent twice so as to overlap as viewed in the Z-axis direction. In the optical unit 100 according to the present embodiment, the flexible printed circuit board 150 is bent so as to overlap as viewed in the optical axis direction, whereby the flexible printed circuit board 150 can be increased in length, and responsiveness of the flexible printed circuit board 150 to the deformation can be improved. Thus, a load on the flexible printed circuit board 150 can be reduced. Since the load applied to the flexible printed circuit board 150 can be reduced in this way, it is possible to increase an amount of rotation of the rotating movable body 110 without increasing the drive current.

More specifically, the bent part 152 includes a first bent portion 152a and a second bent portion 152b. The first bent portion 152a is a bent portion closest to the connection part 113 between the connection part 113 and the positioning part 140 along the extension direction De, and the second bent portion 152b is a bent portion close to the connection part 113 next to the first bent portion 152a between the connection part 113 and the positioning part 140 along the extension direction De.

The fixing part 160 is superposed on the bent part 152 formed by bending the flexible printed circuit board 150, thereby fixing the bent part 152. The fixing part 160 has a shape conforming to the bent shape of the bent part 152. At least a part of the fixing part 160 is fixed to the bent part 152. In FIGS. 3 and 4, the fixing part 160 has a plate shape. However, the fixing part 160 may not have a plate shape. Since the bent part 152 of the flexible printed circuit board 150 is fixed by the fixing part 160, the flexible printed circuit board 150 can smoothly move following the movable body 110.

Here, the fixing part 160 is mounted to the first bent portion 152a and the second bent portion 152b of the bent part 152. The fixing part 160 may be bonded to the bent part 152.

In the optical unit 100 according to the present embodiment, the flexible printed circuit board 150 may have a separation region where the flexible printed circuit board 150 is separated along the extension direction from the first end 151a toward the second end 151b. As described above, the flexible printed circuit board 150 preferably has the separation region. This is because the load applied to the flexible printed circuit board 150 can be effectively reduced. The size of the separation region is not particularly limited, and the flexible printed circuit board 150 may be separated in the entire region from one end to the other end, or may be separated only in a part of the region. Further, the flexible printed circuit board 150 may have a plurality of separation regions.

In the flexible printed circuit board 150, the separation region is more preferably formed such that the flexible printed circuit board 150 is symmetrical along the first intersecting direction D1 when viewed in the extension direction, that is, symmetrical with respect to the central portion in the Y-axis direction (axial direction of yawing). With this configuration, the load applied to the flexible printed circuit board 150 can be more effectively reduced. However, the shape of the separation region is not particularly limited. The flexible printed circuit board 150 is not limited to be separated into two, and may be separated into three.

The positioning part 140 may be mounted such that a gap is formed between the positioning part 140 and the wall 124a. The flexible printed circuit board 150 is positioned in the Z-axis direction when the second end 151b of the flexible printed circuit board 150 passes through the gap of the positioning part 140. Here, the positioning part 140 is integrally formed with the fixed body 120 by being mounted to and fixed to the wall 124a. Due to the positioning part 140 being integrally formed with the fixed body 120, the flexible printed circuit board 150 can be positioned accurately. The term "integrally formed with the fixed body 120" is not limited to being integrally molded, but also includes being mounted to and fixed to the fixed body 120 as in the present embodiment.

Further, in the present embodiment, the positioning part 140 is configured such that the flexible printed circuit board 150 is positioned in the Z-axis direction by passing through the gap. Therefore, the positioning part 140 may be fixed to the fixed body 120 (wall 124a), while allowing the movement in the X-axis direction (movement in the first intersecting direction D1) of the flexible printed circuit board 150. As described above, the positioning part 140 can be fixed to the fixed body 120 so as to allow the movement of the flexible printed circuit board 150 in the X-axis direction, and thus, the positioning part 140 can be fixed to the fixed body 120 without applying a stress to the flexible printed circuit board 150.

In the optical unit 100 according to the present embodiment, the flexible printed circuit board 150 is bent twice. However, the number of bends of the flexible printed circuit board 150 may be relatively small. This can prevent an excessive increase in man-hours for deforming the flexible printed circuit board 150. On the other hand, when the flexible printed circuit board 150 is bent many times, the load applied to the flexible printed circuit board 150 tends to be effectively reduced. Therefore, it is preferable to set the number of bends of the flexible printed circuit board 150 according to the intended use of the optical unit 100 and the like.

The number of bends of the flexible printed circuit board 150 is preferably an even number. In the extension direction from the first end 151a to the second end 151b of the flexible printed circuit board 150, the flexible printed circuit board 150 extends in the direction approaching the movable body 110 in the first intersecting direction by the odd-numbered bent portion, and extends in the direction away from the movable body 110 in the first intersecting direction by the even-numbered bent portion. That is, by setting the number of bends of the flexible printed circuit board 150 to an even number, the flexible printed circuit board 150 can be easily located at a position away from the movable body 110, and the flexible printed circuit board 150 can be easily placed so as to extend in a direction away from the movable body 110. Thus, the contact between the flexible printed circuit board 150 and the movable body 110 can be prevented. Further, the degree of freedom in placing the flexible printed circuit board 150 can be increased.

In the optical unit 100 according to the present embodiment, the fixed body 120 does not have a wall that intersects the first intersecting direction D1 between the connection part 113 and the positioning part 140 on the side in the first intersecting direction. Therefore, it is possible to prevent the flexible printed circuit board 150 extending from the connection part 113 to the positioning part 140 from interfering with the fixed body 120 (for example, an inner wall of a space S formed on the wall).

As shown in FIGS. 3 and 4, the fixing part 160 fixes the bent part 152 of the flexible printed circuit board 150.

Figure 5:
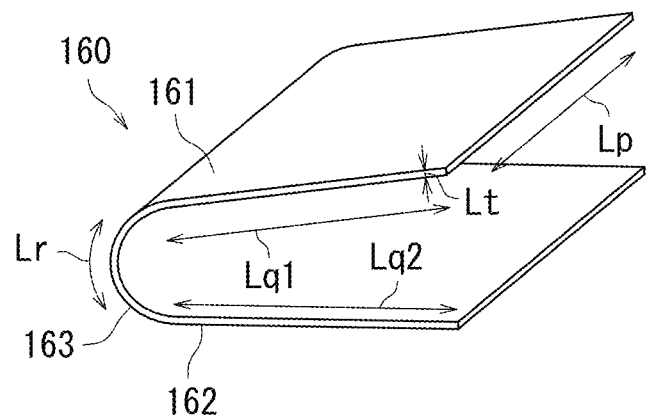
FIG. 5 is a perspective view of a fixing part in the optical unit according to the embodiment.

Next, the fixing part 160 will be described with reference to FIG. 5. FIG. 5 is a perspective view of the fixing part 160.

As shown in FIG. 5, the fixing part 160 is formed by deforming a flat plate member. For example, the fixing part 160 is a plate member having a first flat portion 161, a second flat portion 162, and a curved portion 163. The first flat portion 161 is located at one end of the fixing part 160, and the second flat portion 162 is located at the other end of the fixing part 160. The first flat portion 161 has a flat surface, and the second flat portion 162 has a flat surface. The curved portion 163 is located between the first flat portion 161 and the second flat portion 162. Thus, the fixing part 160 can be formed by bending a flat plate member.

For example, the fixing part 160 is made of metal. As an example, the fixing part 160 is made of stainless steel or aluminum. When the fixing part 160 is made relatively thin, the fixing part 160 may be formed by using shim tape. This can achieve the fixing part 160 having high spring property.

The fixing part 160 may be formed of a material other than metal. For example, the fixing part 160 may be formed of resin. However, the fixing part 160 is preferably formed of a material having a higher elastic modulus than the material of the outer surface of the flexible printed circuit board 150. Typically, the outer peripheral surface of the flexible printed circuit board 150 is formed of a polyimide resin. Therefore, the fixing part 160 is preferably formed of a material having an elastic modulus higher than the elastic modulus of the polyimide resin (about 2000 MPa).

A width Lp of the fixing part 160 is, for example, 2 mm or more and 20 mm or less. The width Lp may be 3 mm or more and 15 mm or less.

Further, a length Lq1 of the first flat portion 161 is, for example, 0.5 mm or more and 10 mm or less, and may be 1 mm or more and 8 mm or less. Similarly, a length Lq2 of the second flat portion 162 may be, for example, 0.5 mm or more and 10 mm or less, and may be 1 mm or more and 8 mm or less. Note that the size of the first flat portion 161 may be the same as the size of the second flat portion 162.

A length Lr of the curved portion 163 is, for example, 0.3 mm or more and 8 mm or less, and may be 0.5 mm or more and 5 mm or less. Typically, the length Lr of the curved portion 163 is shorter than the length Lq1 of the first flat portion 161 and/or the length Lq2 of the second flat portion 162.

When the fixing part 160 is formed by deformation, it is preferable that the fixing part 160 is relatively thin. For example, a thickness Lt of the fixing part 160 is 0.1 mm or more and 2 mm or less.

Here, an adhesive is applied to the inner peripheral surface of the fixing part 160, and the fixing part 160 is fixed to the flexible printed circuit board 150.

Figure 6:
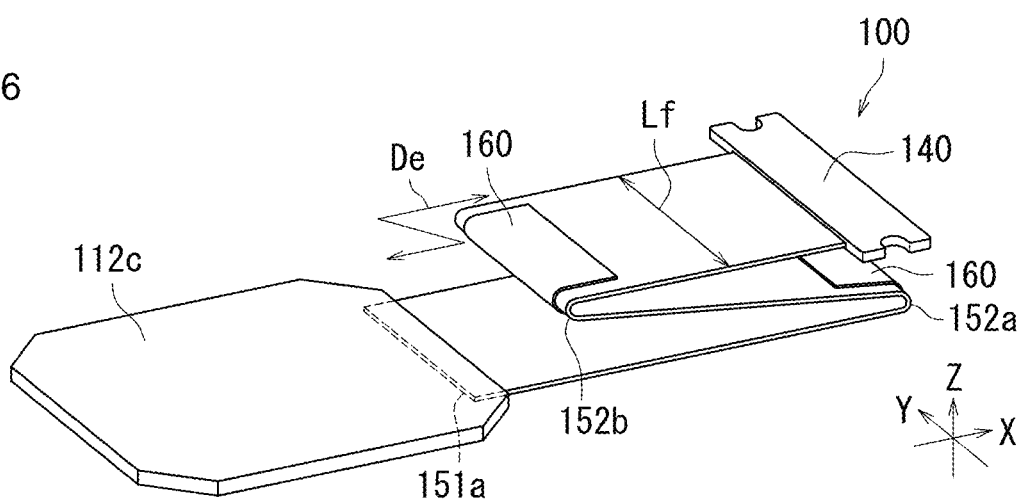
FIG. 6 is a perspective view of the optical unit according to the embodiment.

Next, a method for fixing the flexible printed circuit board 150 using the fixing part 160 in the optical unit 100 will be described with reference to FIGS. 5 and 6. FIG. 6 is a schematic perspective view of the optical unit 100. In FIG. 6, the image sensor 112c, the positioning part 140, the flexible printed circuit board 150, and the fixing part 160 are illustrated, and other components are not illustrated in order to avoid excessive complexity of the drawing.

As shown in FIG. 6, the flexible printed circuit board 150 extends in the extension direction De. The flexible printed circuit board 150 is bent at the bent part 152, and the orientation of the extension direction De is changed at the bent part 152. Here, the flexible printed circuit board 150 is bent twice.

The fixing part 160 fixes the outside of the bent part 152 of the flexible printed circuit board 150. Thus, the position of the bent part 152 of the flexible printed circuit board 150 can be restricted, whereby the load on the flexible printed circuit board 150 can be reduced.

The flexible printed circuit board 150 extends from the first end 151a along the extension direction De. In the flexible printed circuit board 150, the length (width Lf) in the direction orthogonal to the extension direction De is, for example, 1.5 mm or more and 18 mm or less. The width Lf may be 2 mm or more and 12 mm or less. The fixing part 160 is disposed so that the length Lp is parallel to the direction orthogonal to the extension direction De of the flexible printed circuit board 150. The length (width Lp) of the fixing part 160 along a width direction perpendicular to the extension direction De is smaller than the length (width Lf) of the flexible printed circuit board 150 along the width direction on the same plane as the flexible printed circuit board 150. Therefore, it is possible to prevent damage of the flexible printed circuit board 150 and/or the periphery thereof due to the contact between the fixing part 160 and the periphery of the flexible printed circuit board 150.

The fixing part 160 may be bonded to the flexible printed circuit board 150 before the flexible printed circuit board 150 is bent, and the fixing part 160 may be bent together with the flexible printed circuit board 150. Alternatively, the fixing part 160 may be curved separately from the bending of the flexible printed circuit board 150, and after the bent part 152 of the flexible printed circuit board 150 is formed, the fixing part 160 may be attached to the bent part 152 of the flexible printed circuit board 150 with an adhesive being applied to the inner peripheral surface of the fixing part 160 or the outer peripheral surface of the bent part 152 of the flexible printed circuit board 150.

When the fixing part 160 is bonded to the bent part 152 of the flexible printed circuit board 150, the adhesive may be applied between the first flat portion 161 of the fixing part 160 and the flexible printed circuit board 150 and between the second flat portion 162 of the fixing part 160 and the flexible printed circuit board 150, while the adhesive may not be applied between the curved portion 163 of the fixing part 160 and the flexible printed circuit board 150.

In FIG. 6, the fixing part 160 fixes the outside of the bent part 152 of the flexible printed circuit board 150, but the present embodiment is not limited thereto. The fixing part 160 may fix the inside of the bent part 152 of the flexible printed circuit board 150.

Figure 7:
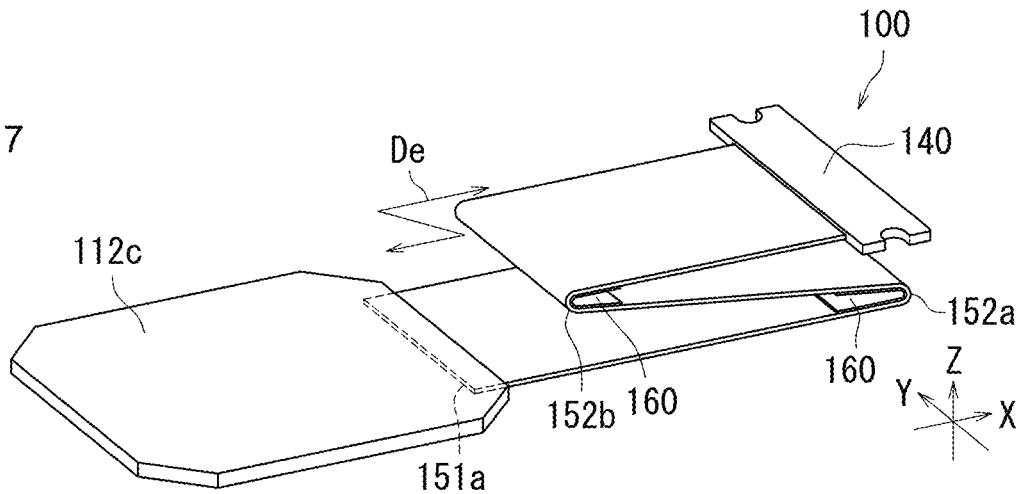
FIG. 7 is a perspective view of the optical unit according to the embodiment.

Next, a method for fixing the flexible printed circuit board 150 using the fixing part 160 in the optical unit 100 will be described with reference to FIG. 7. FIG. 7 is a schematic perspective view of the optical unit 100. In FIG. 7, the image sensor 112c, the positioning part 140, the flexible printed circuit board 150, and the fixing part 160 are illustrated, and other components are not illustrated in order to avoid excessive complexity of the drawing.

As shown in FIG. 7, the fixing part 160 fixes the inside of the bent part 152 of the flexible printed circuit board 150. Thus, the position of the bent part 152 of the flexible printed circuit board 150 can be restricted, whereby the load on the flexible printed circuit board 150 can be reduced.

In the description with reference to FIGS. 6 and 7, the fixing part 160 is attached to either the outside or the inside of the bent part 152 of the flexible printed circuit board 150, but the present embodiment is not limited thereto. The fixing part 160 may be mounted on both the outside and the inside of the bent part 152 of the flexible printed circuit board 150.

Further, in the above description, the fixing part 160 has a plate shape, but the present embodiment is not limited thereto. The fixing part 160 may be constituted by a coating film formed by applying a resist. Even when the fixing part 160 is constituted by a resist film, it is preferable that the fixing part 160 is disposed on the bent part 152 of the flexible printed circuit board 150 so as to extend from the upstream side (connection part 113 side) to the downstream side (positioning part 140 side), and a space is formed between the upstream side and the downstream side of the fixing part 160.

Note that another member may be mounted to the flexible printed circuit board 150 together with the fixing part 160.

Figure 8:
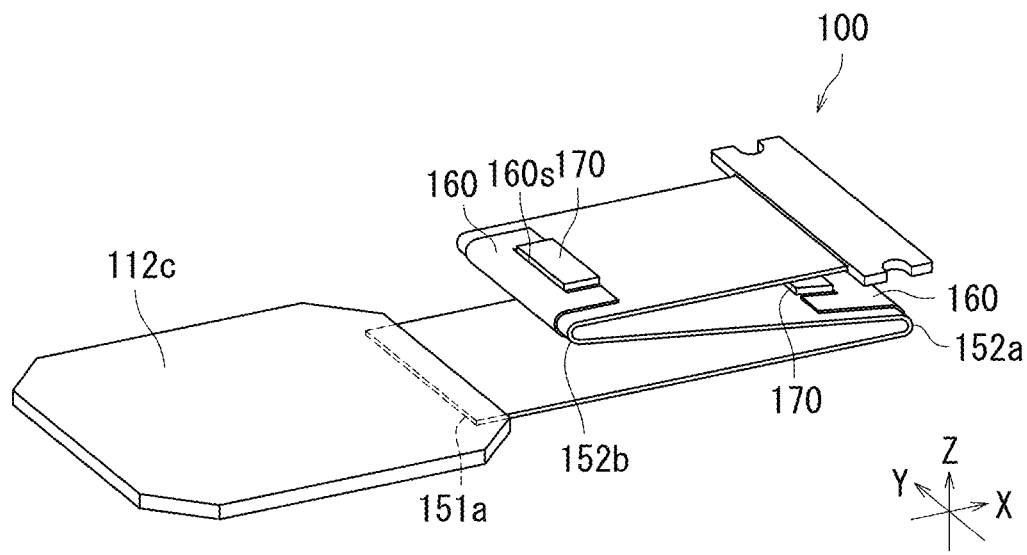
FIG. 8 is a perspective view of the optical unit according to the embodiment.

Next, a method for fixing the flexible printed circuit board 150 using the fixing part 160 in the optical unit 100 will be described with reference to FIG. 8. FIG. 8 is a schematic perspective view of the optical unit 100. Here, a reinforcing part 170 is bonded to the flexible printed circuit board 150 together with the fixing part 160.

For example, the thickness of the reinforcing part 170 is larger than the thickness of the fixing part 160. For example, the thickness of the reinforcing part 170 is 0.3 mm or more and 3 mm or less.

The reinforcing part 170 is bonded to the flexible printed circuit board 150. The reinforcing part 170 engages with the fixing part 160. As a result, the fixing part 160 can be more tightly fixed to the flexible printed circuit board 150.

The fixing part 160 is provided with a recess 160s, and the reinforcing part 170 is disposed in the recess 160s of the fixing part 160. As a result, the reinforcing part 170 is more tightly engaged with the fixing part 160.

It is preferable to apply an adhesive to at least one of the side surface of the fixing part 160 and the side surface of the reinforcing part 170. With this configuration, the reinforcing part 170 is bonded to the fixing part 160. Therefore, the fixing part 160 can be more tightly fixed to the flexible printed circuit board 150.

Figure 9:
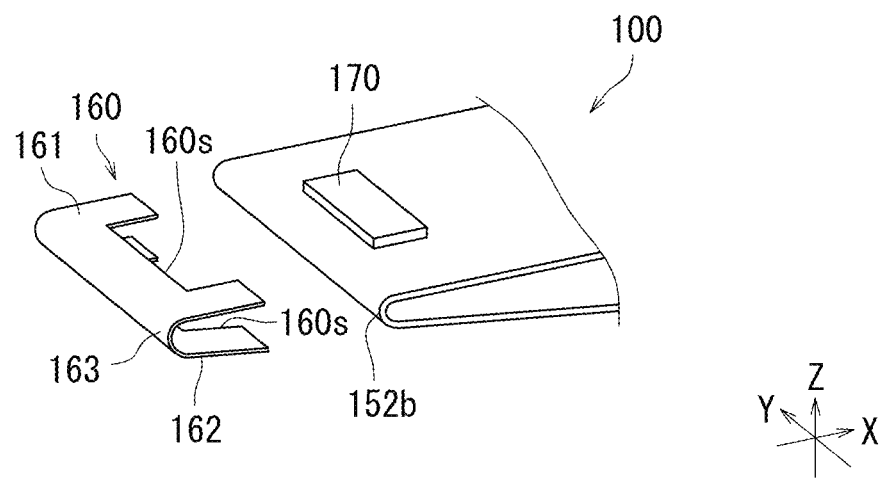
FIG. 9 is a perspective view of the optical unit according to the embodiment.

Next, a method for fixing the flexible printed circuit board 150 using the fixing part 160 in the optical unit 100 will be described with reference to FIG. 9. FIG. 9 is a schematic perspective view of the optical unit 100. In FIG. 9, the reinforcing part 170 is bonded to the flexible printed circuit board 150 before the fixing part 160 is bonded.

The fixing part 160 and the reinforcing part 170 are attached to the flexible printed circuit board 150 as follows.

As shown in FIG. 9, the recesses 160s are provided in the first flat portion 161 and the second flat portion 162 of the fixing part 160. Further, in the bent part 152 of the flexible printed circuit board 150, the reinforcing parts 170 are mounted on the upstream side and the downstream side of the line of bending, respectively. The fixing part 160 is mounted on the flexible printed circuit board 150 so that the reinforcing parts 170 fit into the recesses 160s of the fixing part 160. As a result, the fixing part 160 can be attached to the flexible printed circuit board 150.

Typically, when a load on the flexible printed circuit board with respect to the movable body is relatively large, the movable body cannot be driven appropriately unless the driving force is increased. However, in the optical unit 100 according to the present embodiment, the movable body can be appropriately driven even with a relatively small driving force, because the load on the flexible printed circuit board 150 with respect to the movable body 110 is relatively small.

Typically, the load on the flexible printed circuit board 150 can be reduced as the number of bends of the flexible printed circuit board 150 increases.

In the above description with reference to FIGS. 1 to 9, the flexible printed circuit board 150 extends from the connection part 113 along the first intersecting direction D1, and the first bent portion 152a is separated from the movable body 110. However, the present embodiment is not limited thereto. The first bent portion 152a may be disposed on the surface of the movable body 110.

Figure 10:
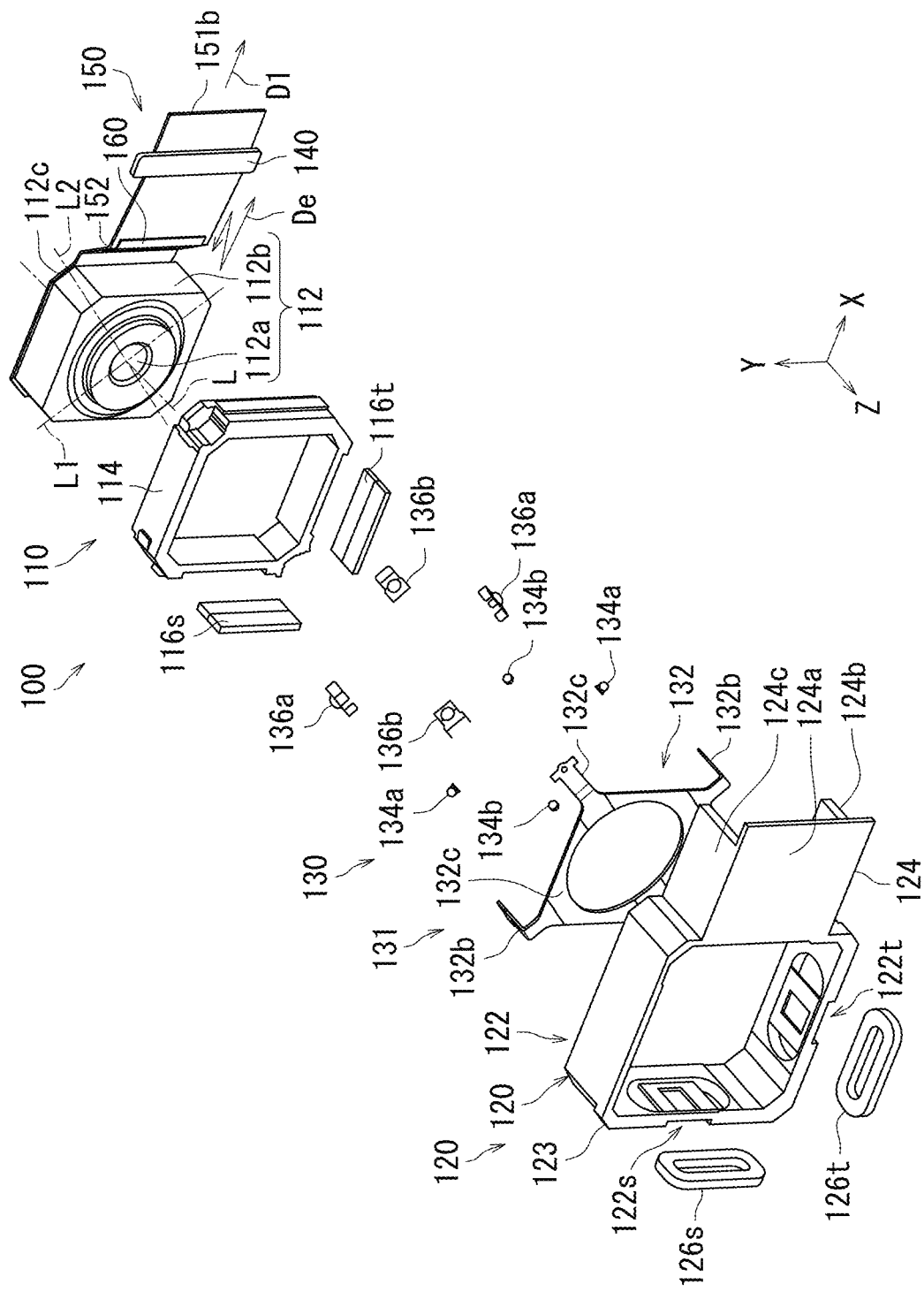
FIG. 10 is an exploded perspective view of the optical unit according to the embodiment.
Figure 11:
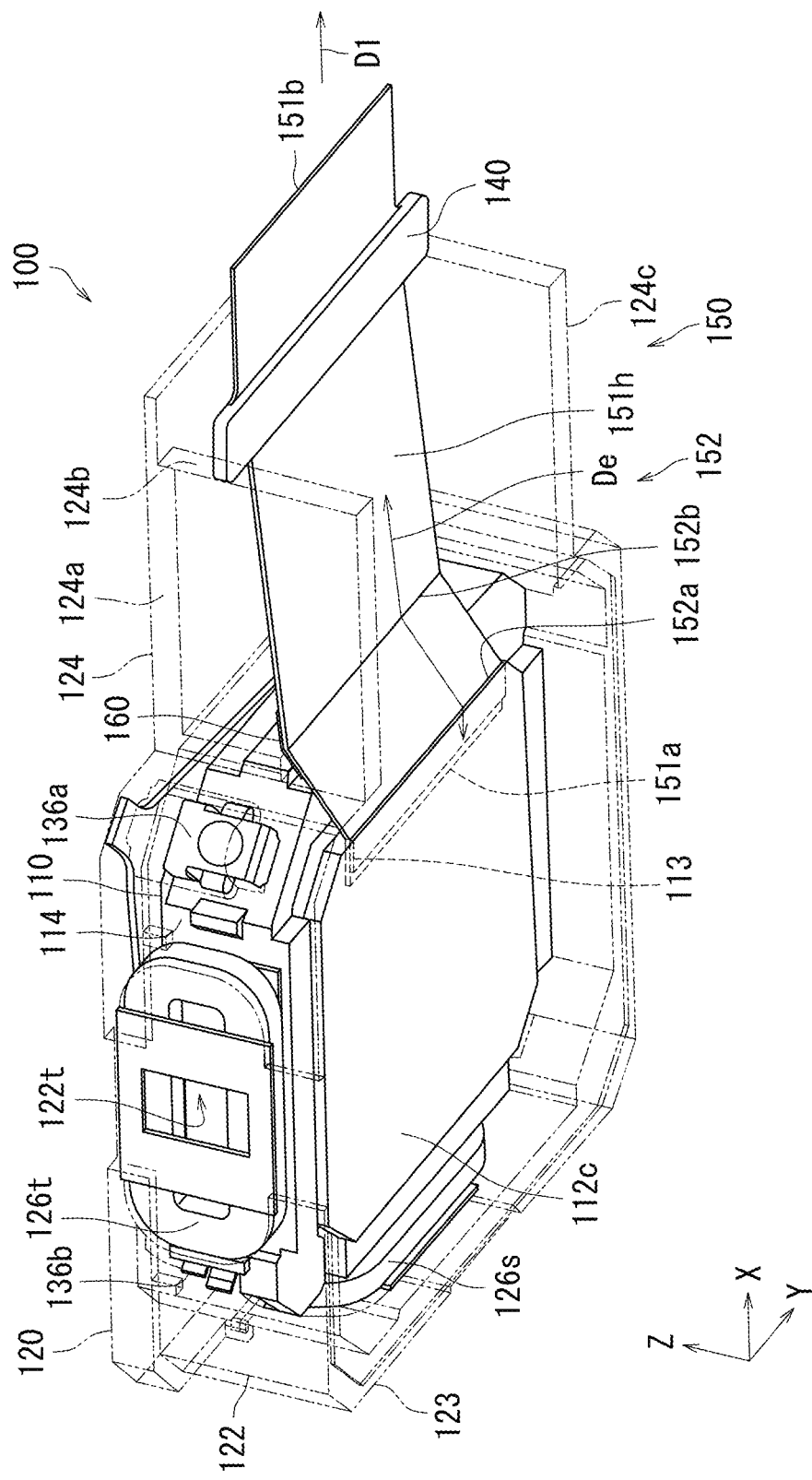
FIG. 11 is a perspective view of the optical unit according to the embodiment.

Next, the optical unit 100 according to the present embodiment will be described with reference to FIGS. 10 to 12. FIG. 10 is an exploded perspective view of the optical unit 100, and FIG. 11 is a perspective view of the optical unit 100. In FIG. 11, the fixed body 120 is indicated by a chain line in order to avoid excessive complexity of the drawing. The optical unit 100 in FIGS. 10 and 11 has the same configuration as the optical unit 100 described above with reference to FIGS. 3 and 4, except for the arrangement of the bent part 152 of the flexible printed circuit board 150. Therefore, duplicate descriptions are omitted to avoid redundancy.

The first bent portion 152a of the flexible printed circuit board 150 is located on the surface of the movable body 110. The flexible printed circuit board 150 is bent at a relatively large angle such as 45° at the first bent portion 152a. Therefore, the second bent portion 152b is located near the movable body 110.

Figure 12:
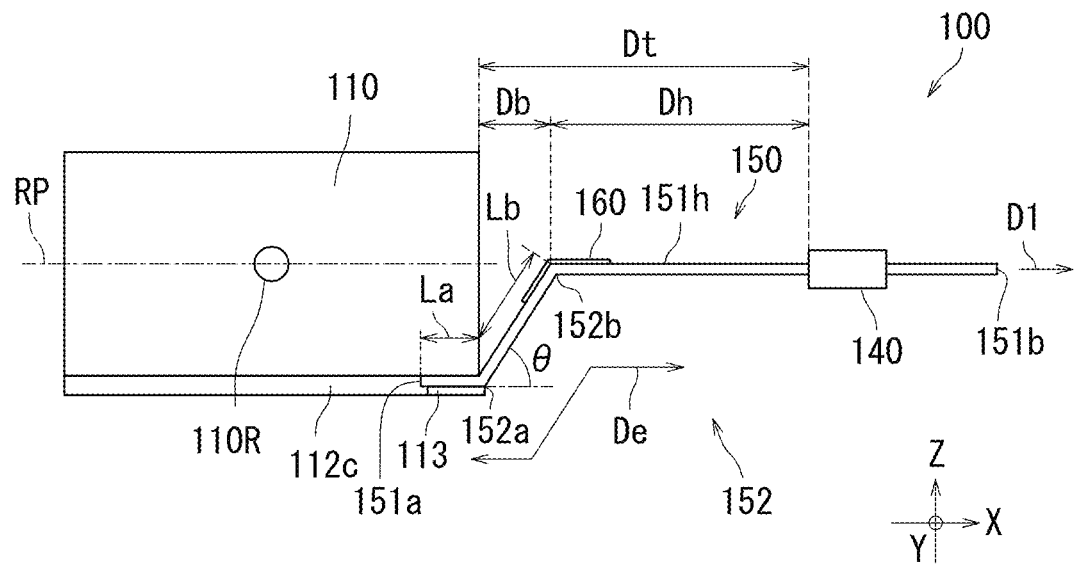
FIG. 12 is a schematic view of the optical unit according to the embodiment.

FIG. 12 is a schematic view of the optical unit 100 according to the present embodiment. In FIG. 12, the movable body 110, the positioning part 140, and the flexible printed circuit board 150 are illustrated, while the fixed body 120 and the support mechanism 130 are not illustrated in order to avoid excessive complexity of the drawing.

The movable body 110 is rotatable around a rotation axis 110R. The rotation axis 110R extends parallel to the Y axis. The rotation axis 110R may be located at the center of the movable body 110 in a plan view of the movable body 110 viewed in the Y axis. However, the rotation axis 110R is not necessarily located at the center of the movable body 110.

FIG. 12 shows a reference plane RP. The reference plane RP extends from the rotation axis 110R of the movable body 110 along the first intersecting direction D1. The first intersecting direction D1 is parallel to the X axis.

As shown in FIG. 12, in the flexible printed circuit board 150, the bent part 152 has the first bent portion 152a and the second bent portion 152b. The first bent portion 152a is a bent portion closest to the first end 151a of the flexible printed circuit board 150 between the connection part 113 and the positioning part 140 along the extension direction De. Further, the second bent portion 152b is close to the first end 151a of the flexible printed circuit board 150 next to the first bent portion 152a between the connection part 113 and the positioning part 140 along the extension direction De.

The first bent portion 152a is located on a side where the connection part 113 is located with respect to the reference plane RP. On the other hand, the second bent portion 152b is located on the reference plane RP. With this configuration, the optical unit 100 according to the present embodiment can reduce a load on the flexible printed circuit board 150.

In the optical unit 100 according to the present embodiment, the fixing part 160 is disposed at the bent part 152 of the flexible printed circuit board 150. Specifically, the fixing part 160 is disposed at the second bent portion 152b. Here, the angle between the flat portions of the fixing part 160 exceeds 90°, and the fixing part 160 is disposed on the outside of the second bent portion 152b. However, as described above, the fixing part 160 may be disposed on the inside of the second bent portion 152b.

In the optical unit 100 described above with reference to FIGS. 10 to 12, the fixing part 160 is mounted so as to cover the second bent portion 152b, but the present embodiment is not limited thereto. The fixing part 160 may be mounted so as to cover not only the second bent portion 152b but also the first bent portion 152a.

In the optical unit 100 described with reference to FIGS. 1 to 12, the bent part 152 includes the first bent portion 152a and the second bent portion 152b, but the present embodiment is not limited thereto. The bent part 152 may include three or more bent portions.

Next, the optical unit 100 according to the present embodiment will be described with reference to FIG. 13.

Figure 13:
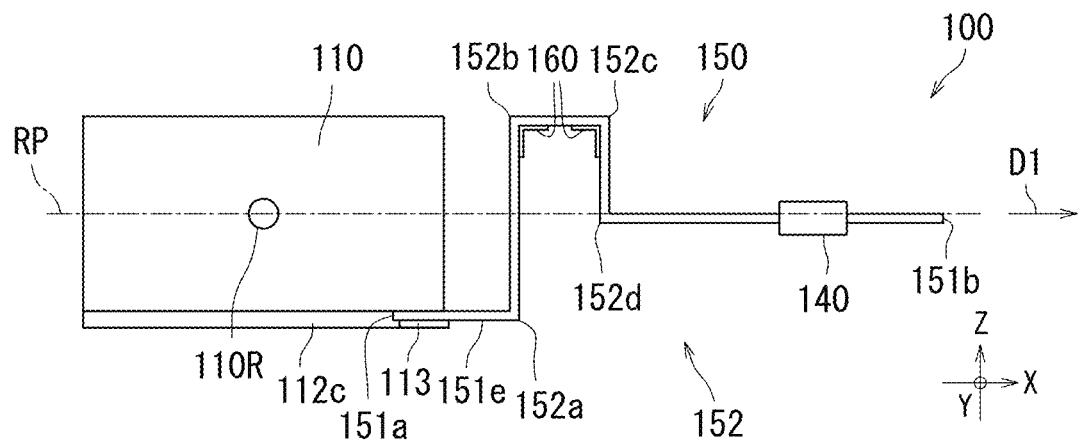
FIG. 13 is a schematic view of the optical unit according to the embodiment.

FIG. 13 is a schematic view of the optical unit 100 according to the present embodiment. The optical unit 100 in FIG. 13 has the same configuration as the optical unit 100 described above with reference to FIG. 12, except that the second bent portion 152b is located on a side different from the side where the connection part 113 is located with respect to the reference plane RP, and the bent part 152 has three or more bent portions. Therefore, duplicate descriptions are omitted to avoid redundancy.

As shown in FIG. 13, the bent part 152 includes a third bent portion 152c and a fourth bent portion 152d in addition to the first bent portion 152a and the second bent portion 152b. The fourth bent portion 152d is a bent portion close to the connection part 113 next to the third bent portion 152c between the connection part 113 and the positioning part 140 along the extension direction De.

The first bent portion 152a is located away from the surface of the movable body 110. The flexible printed circuit board 150 further has an extension part 151e extending from the first end 151a to the first bent portion 152a along the first intersecting direction D1. The first bent portion 152a is preferably bent at an angle of 90° or more with respect to a portion between the first end 151a and the first bent portion 152a. Here, the first bent portion 152a is bent at an angle of 90° with respect to the portion between the first end 151a and the first bent portion 152a. Thus, the second bent portion 152b can be located near the movable body 110, so that the load on the flexible printed circuit board 150 can be further reduced.

Further, the first bent portion 152a is located on the side where the connection part 113 is located with respect to the reference plane RP, while the second bent portion 152b is located on the side different from the side where the connection part 113 is located with respect to the reference plane RP. With this configuration, the load on the flexible printed circuit board 150 can be reduced.

A portion of the flexible printed circuit board 150 between the first bent portion 152a and the second bent portion 152b intersects the reference plane RP. As a result, the load on the flexible printed circuit board 150 can be reduced, and even if the rotation of the movable body 110 is relatively large, the flexible printed circuit board 150 can follow the movable body 110.

The fixing part 160 is attached to the second bent portion 152b and the third bent portion 152c. Here, the fixing part 160 fixes the inside of the second bent portion 152b and the inside of the third bent portion 152c.

The flexible printed circuit board 150 may pass across the reference plane RP more than once. In FIG. 13, the flexible printed circuit board 150 passes across the reference plane RP twice. Specifically, the flexible printed circuit board 150 intersects the reference plane RP between the first bent portion 152a and the second bent portion 152b. Further, the fourth bent portion 152d of the flexible printed circuit board 150 is located on the reference plane RP, and a portion from the third bent portion 152c to the fourth bent portion 152d of the flexible printed circuit board 150 reaches the reference plane RP. When the flexible printed circuit board 150 passes across the reference plane RP multiple times as described above, a load on the flexible printed circuit board 150 can be reduced.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. An optical unit, comprising:
a movable body provided with an optical module;
a fixed body;
a support mechanism that supports the movable body to be rotatable, with respect to the fixed body, about at least one rotation axis intersecting an optical axis direction of the optical module;
a flexible printed circuit board that has a first end connected to a connection part provided on the movable body, the flexible printed circuit board being disposed on a side in a first intersecting direction intersecting the optical axis direction with respect to the movable body; and
a fixing part that is disposed so as to be superposed onto a bent part formed by bending the flexible printed circuit board, wherein
the fixing part has a shape conforming to a bent shape of the bent part,
the fixing part is at least partially fixed to the bent part,
the fixing part is a plate member having
a first flat portion,
a second flat portion, and
a curved portion located between and connecting the first flat portion and the second flat portion, a shape of the curved portion conforming to the bent shape of the bent part, and
the fixing part is formed of a material having an elastic modulus higher than a material of an outer surface of the flexible printed circuit board.

2. The optical unit according to claim 1, wherein the fixing part fixes an outside of the bent part of the flexible printed circuit board.

3. The optical unit according to claim 1, wherein the fixing part fixes an inside of the bent part of the flexible printed circuit board.

4. The optical unit according to claim 1, wherein
the flexible printed circuit board extends from the first end in an extension direction, and
a length of the fixing part along a width direction perpendicular to the extension direction is smaller than a length of the flexible printed circuit board along the width direction on a plane same as the flexible printed circuit board.

5. The optical unit according to claim 1, wherein the fixing part is made of metal.

6. The optical unit according to claim 1, further comprising a reinforcing part that is bonded to the flexible printed circuit board and engaged with the fixing part.

7. The optical unit according to claim 6, wherein
the fixing part is provided with a recess, and
the reinforcing part is placed in the recess of the fixing part.

8. The optical unit according to claim 6, wherein the reinforcing part is bonded to the fixing part.

9. The optical unit according to claim 1, wherein
the first and second flat portions extend from first and second ends of the curved portion, respectively, toward the fixed body.

10. The optical unit according to claim 1, wherein
the first and second flat portions extend from first and second ends of the curved portion, respectively, away from the fixed body.

11. The optical unit according to claim 1, wherein the elastic modulus of the material of the fixing part is higher than about 2000 MPa.

12. The optical unit according to claim 1, wherein the fixing part has spring property.

13. The optical unit according to claim 1, wherein the shape of the fixing part is a U shape.

14. The optical unit according to claim 1, further comprising
a reinforcing part that is bonded to the flexible printed circuit board and engaged with a recess in the first flat portion.

15. The optical unit according to claim 14, wherein the reinforcing part is bonded to the fixing part.

16. The optical unit according to claim 1, wherein the fixing part is a flat plate member bent to have the first flat portion, the second flat portion, and the curved portion.

17. An optical unit, comprising:
a movable body provided with an optical module;
a fixed body;
a support mechanism that supports the movable body to be rotatable, with respect to the fixed body, about at least one rotation axis intersecting an optical axis direction of the optical module;
a flexible printed circuit board that has a first end connected to a connection part provided on the movable body, the flexible printed circuit board being disposed on a side in a first intersecting direction intersecting the optical axis direction with respect to the movable body;
a fixing part that is disposed so as to be superposed onto a bent part formed by bending the flexible printed circuit board, wherein
the fixing part has a shape conforming to a bent shape of the bent part,
the fixing part is at least partially fixed to the bent part, and
the fixing part is a plate member having
a first flat portion,
a second flat portion, and
a curved portion located between and connecting the first flat portion and the second flat portion, a shape of the curved portion conforming to the bent shape of the bent part; and
an adhesive between the first flat portion and the flexible printed circuit board, and between the second flat portion and the flexible printed circuit board, wherein the adhesive is absent between the curved portion and the bent part of the flexible printed circuit board.

* * * * *